United States Patent
Aramata

(10) Patent No.: US 10,153,797 B2
(45) Date of Patent: Dec. 11, 2018

(54) COMMUNICATION MODULE

(71) Applicant: Murata Manufacturing Co., Ltd., Kyoto (JP)

(72) Inventor: Tomohide Aramata, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/834,855

(22) Filed: Dec. 7, 2017

(65) Prior Publication Data

US 2018/0167094 A1  Jun. 14, 2018

(30) Foreign Application Priority Data

Dec. 9, 2016 (JP) ................................. 2016-239730

(51) Int. Cl.

| | |
|---|---|
| *H04B 1/10* | (2006.01) |
| *H03H 7/46* | (2006.01) |
| *H04B 1/00* | (2006.01) |
| *H04B 1/18* | (2006.01) |
| *H04B 1/401* | (2015.01) |
| *H04B 1/52* | (2015.01) |
| *H04B 1/56* | (2006.01) |

(Continued)

(52) U.S. Cl.
CPC ........... *H04B 1/1081* (2013.01); *H03H 7/465* (2013.01); *H04B 1/00* (2013.01); *H04B 1/10* (2013.01); *H04B 1/18* (2013.01); *H04B 1/401* (2013.01); *H04B 1/52* (2013.01); *H04B 1/56* (2013.01); *H04L 5/14* (2013.01); *H03H 7/38* (2013.01)

(58) Field of Classification Search
CPC .......... H04B 1/1081; H04B 1/00; H04B 1/10; H04B 1/18; H04B 1/401; H04B 1/52; H04B 1/56; H04B 1/06; H04B 1/406; H03H 7/465; H03H 7/38; H03H 7/466
See application file for complete search history.

(56) References Cited

U.S. PATENT DOCUMENTS

2004/0209590 A1* 10/2004 Forrester ................ H04B 1/406
  455/324
2006/0052131 A1*  3/2006 Ichihara ................. H04B 1/005
  455/552.1

(Continued)

FOREIGN PATENT DOCUMENTS

JP  2016-015673 A  1/2016

*Primary Examiner* — Junpeng Chen
(74) *Attorney, Agent, or Firm* — Pearne & Gordon LLP

(57) ABSTRACT

A communication module includes a first switch circuit that receives a first or second received signal and that outputs the first received signal from a first terminal thereof or the second received signal from a second terminal thereof, a first low-noise amplifier that amplifies the first received signal, a second low-noise amplifier that amplifies the second received signal, a first filter circuit disposed between the first switch circuit and the first low-noise amplifier, and a second filter circuit disposed between the first switch circuit and the second low-noise amplifier. The first filter circuit has greater signal loss than the second filter circuit. A signal path from the first terminal of the first switch circuit to the first low-noise amplifier via the first filter circuit has a shorter length than that from the second terminal of the first switch circuit to the second low-noise amplifier via the second filter circuit.

8 Claims, 8 Drawing Sheets

(51) Int. Cl.
*H04L 5/14* (2006.01)
*H03H 7/38* (2006.01)

(56) References Cited

U.S. PATENT DOCUMENTS

| | | | |
|---|---|---|---|
| 2009/0128254 A1* | 5/2009 | Goi | H03H 7/465 333/101 |
| 2013/0122831 A1* | 5/2013 | Desclos | H04B 1/44 455/78 |
| 2014/0203887 A1* | 7/2014 | Murata | H03H 7/38 333/103 |
| 2014/0321312 A1* | 10/2014 | Narahashi | H04B 1/525 370/252 |
| 2016/0006408 A1 | 1/2016 | Murata | |
| 2016/0020737 A1* | 1/2016 | Kong | H03F 3/19 455/73 |
| 2018/0034414 A1* | 2/2018 | Niu | H03F 1/0205 |

* cited by examiner

COMMUNICATION MODULE

This application claims priority from Japanese Patent Application No. 2016-239730 filed on Dec. 9, 2016. The content of this application is incorporated herein by reference in its entirety.

BACKGROUND OF THE DISCLOSURE

1. Field of the Disclosure

The present disclosure relates to a communication module.

2. Description of the Related Art

A mobile terminal that uses communication networks for cellular phones includes a communication module including an amplifier for amplifying a radio frequency (RF) signal to be transmitted to or received from a base station. The number of users of mobile terminals has explosively increased in recent years, and the number of frequency bands (the number of bands) used for cellular phones has also increased to address an increase in communication traffic caused by the increasing number of users. It is thus desirable for a communication module to support such multiple frequency bands.

For example, Japanese Unexamined Patent Application Publication No. 2016-15673 discloses a configuration including a plurality of duplexers associated with a plurality of frequency bands and switches to distribute the received signals supplied from an antenna to the respective duplexers in accordance with the frequency bands of the received signals.

Duplexers allow signals having different frequencies to pass therethrough in accordance with the respective frequency bands with which the duplexers are associated, and thus have different circuit configurations. Insertion of duplexers may result in different levels of signal loss depending on the frequency bands with which the duplexers are associated. In the configuration disclosed in Japanese Unexamined Patent Application Publication No. 2016-15673, the level of signal loss differs depending on the frequency band, and the receiver sensitivity varies accordingly.

BRIEF SUMMARY OF THE DISCLOSURE

Accordingly, it is an object of the present disclosure to provide a communication module with reduced variations in receiver sensitivity for respective frequency bands.

According to preferred embodiments of the present disclosure, a communication module includes a first switch circuit that receives a first received signal in a first frequency band or a second received signal in a second frequency band and that outputs the first received signal from a first terminal thereof or the second received signal from a second terminal thereof, a first low-noise amplifier that amplifies the first received signal, a second low-noise amplifier that amplifies the second received signal, a first filter circuit disposed between the first terminal of the first switch circuit and the first low-noise amplifier and configured to allow received frequencies in the first frequency band to pass therethrough, and a second filter circuit disposed between the second terminal of the first switch circuit and the second low-noise amplifier and configured to allow received frequencies in the second frequency band to pass therethrough. The first filter circuit has greater signal loss than the second filter circuit. A signal path from the first terminal of the first switch circuit to the first low-noise amplifier via the first filter circuit has a shorter length than a signal path from the second terminal of the first switch circuit to the second low-noise amplifier via the second filter circuit.

According to preferred embodiments of the present disclosure, it may be possible to provide a communication module with reduced variations in receiver sensitivity for respective frequency bands.

Other features, elements, characteristics and advantages of the present disclosure will become more apparent from the following detailed description of preferred embodiments of the present disclosure with reference to the attached drawings.

DETAILED DESCRIPTION OF THE DISCLOSURE

Embodiments of the present disclosure will be described hereinafter with reference to the drawings. The same or substantially the same components are designated by the same numerals and are not described again.

Figure 1:
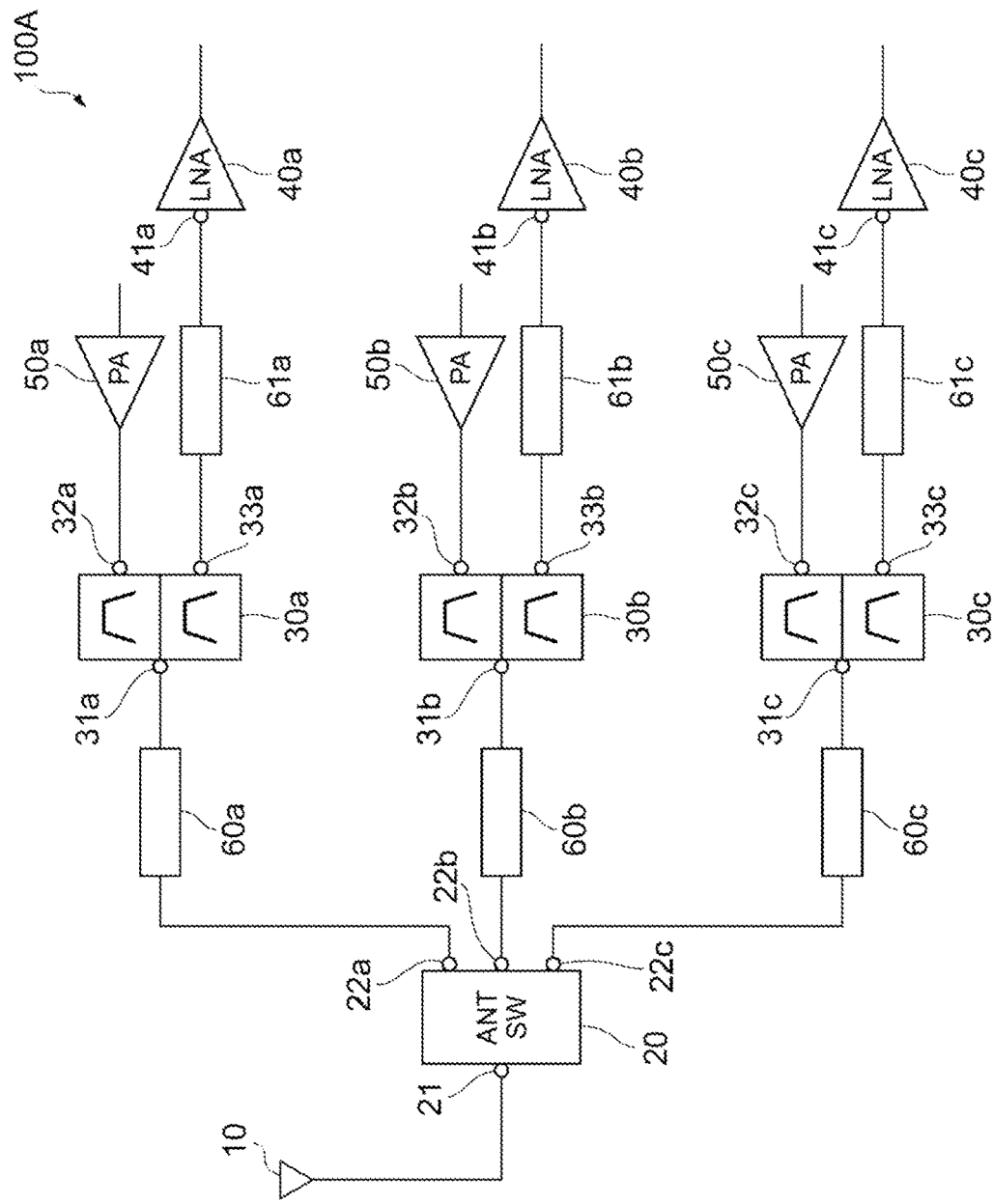
FIG. 1 illustrates an example configuration of a communication module according to a first embodiment of the present disclosure.

FIG. 1 illustrates a communication module 100A, which is an example configuration of a communication module according to an embodiment of the present disclosure. The communication module 100A is incorporated in a mobile communication device such as a cellular phone, for example, and is used to transmit and receive various signals such as audio signals or data signals to and from a base station. The communication module 100A supports a plurality of radio frequency (RF) bands (multiband). The communication module 100A also supports a plurality of communication systems (multimode) such as third generation (3G) mobile communication systems and fourth generation (4G) mobile communication systems. The communication systems supported by the communication module 100A are not limited to the communication systems described above, and other communication systems such as second generation (2G) mobile communication systems or fifth generation (5G) mobile communication systems may be supported. The communication module 100A may also support carrier aggregation.

As illustrated in FIG. 1, the communication module 100A includes an antenna 10, an antenna switch 20, duplexers 30a, 30b, and 30c, low-noise amplifiers (LNAs) 40a, 40b, and 40c, power amplifiers (PAs) 50a, 50b, and 50c, and lines 60a, 60b, 60c, 61a, 61b, and 61c. The communication module 100A has signal paths associated with three bands Band_a, Band_b, and Band_c. In the following description, elements identified by numerals including the letter "a" are elements associated with the band Band_a, elements identified by numerals including the letter "b" are elements associated with the band Band_b, and elements identified by numerals including the letter "c" are elements associated with the band Band_c. For convenience of description, for example, the duplexers 30a, 30b, and 30c are also collectively referred to simply as the "duplexers 30". This also applies to other constituent elements.

The antenna 10 transmits and receives RF signals between the mobile terminal and a base station.

The antenna switch 20 (first switch circuit) switches signal paths between the antenna 10 and the duplexers 30 in accordance with the frequency band of an RF signal. Specifically, for example, the antenna switch 20 electrically connects a terminal 21 to a terminal 22a to transmit and receive an RF signal in the band Band_a (first frequency band). Thus, a received signal (first received signal) inputted to the terminal 21 is outputted from the terminal 22a (first terminal) to the line 60a. In addition, a transmit signal inputted to the terminal 22a is outputted from the terminal 21 to the antenna 10. Likewise, the antenna switch 20 electrically connects the terminal 21 to a terminal 22b to transmit and receive an RF signal in the band Band_b (second frequency band). Thus, a received signal (second received signal) inputted to the terminal 21 is outputted from the terminal 22b (second terminal) to the line 60b. In addition, a transmit signal inputted to the terminal 22b is outputted from the terminal 21 to the antenna 10. Likewise, the antenna switch 20 electrically connects the terminal 21 to a terminal 22c to transmit and receive an RF signal in the band Band_c. Thus, a received signal inputted to the terminal 21 is outputted from the terminal 22c to the line 60c. In addition, a transmit signal inputted to the terminal 22c is outputted from the terminal 21 to the antenna 10.

The duplexers 30a (first filter circuit), 30b (second filter circuit), and 30c are associated with the bands Band_a, Band_b, and Band_c, respectively. The configuration of each of the duplexers 30 will be described, taking the duplexer 30a as an example. The duplexer 30a includes a common node 31a, a transmit node 32a, and a received node 33a. The duplexer 30a outputs a transmit signal in the band Band_a from the power amplifier 50a to the terminal 22a of the antenna switch 20 via the transmit node 32a and the common node 31a. In addition, the duplexer 30a outputs a received signal in the band Band_a from the terminal 22a of the antenna switch 20 to the low-noise amplifier 40a via the common node 31a and the received node 33a. The duplexer 30a is constituted by, for example, a low-pass filter (LPF), a band pass filter (BPF), or the like that allows fundamental components with received frequencies or transmit frequencies in the band Band_a to pass therethrough and that attenuates harmonic components. The configuration of the duplexers 30b and 30c is similar to that of the duplexer 30a and is not described in detail herein.

Since the duplexers 30 have different circuit configurations depending on the frequencies in the frequency bands that the duplexers 30 allow to pass therethrough, the levels of signal loss may vary due to the insertion of the duplexers 30. In the following, the variations in the level of signal loss will be described using the bands Band_a, Band_b, and Band_c as example frequency bands, where the band Band_a is Band 26 (which covers received frequencies of 859 to 894 MHz) for Long Term Evolution (LTE), the band Band_b is Band 20 (which covers received frequencies of 791 to 821 MHz), and the band Band_c is Band 12 (which covers received frequencies of 728 to 746 MHz). The frequency bands given above are examples, and the frequency bands supported by the communication module 100A are not limited to these frequency bands.

Figure 2A:
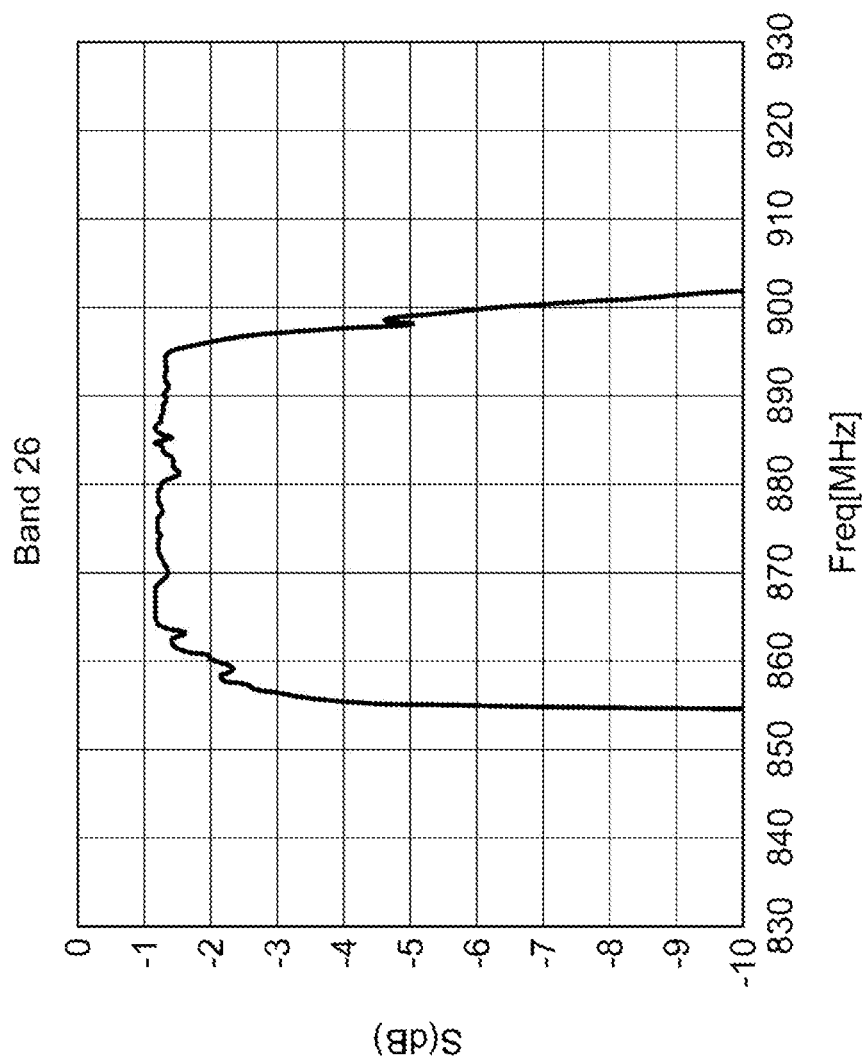
FIG. 2A is a graph illustrating simulation results of insertion loss of a duplexer in the communication module illustrated in FIG. 1.
Figure 2B:
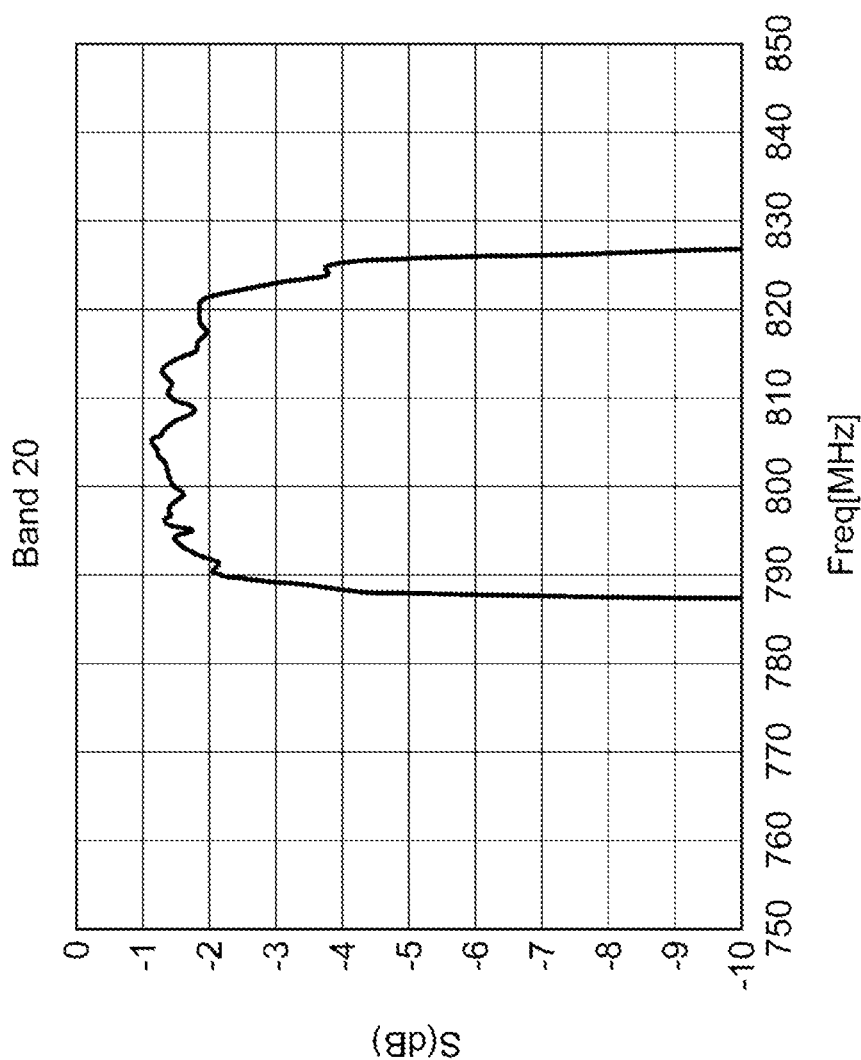
FIG. 2B is a graph illustrating simulation results of insertion loss of a duplexer in the communication module illustrated in FIG. 1.
Figure 2C:
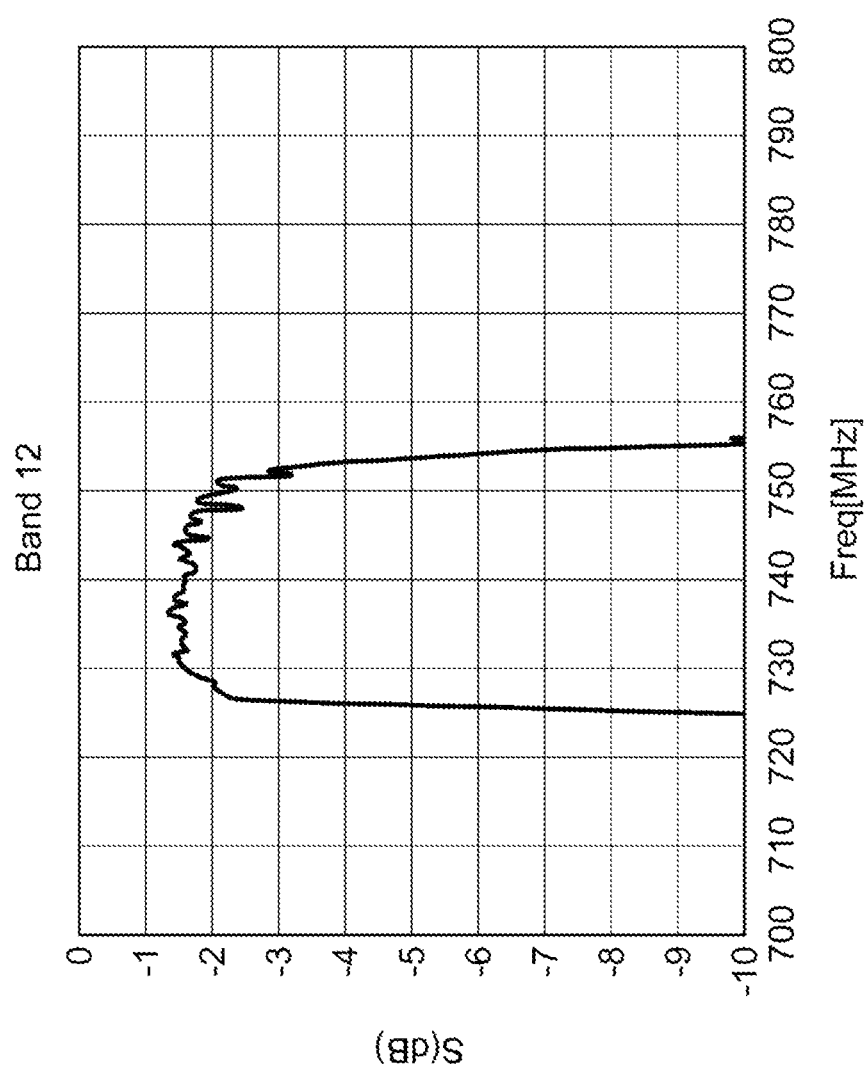
FIG. 2C is a graph illustrating simulation results of insertion loss of a duplexer in the communication module illustrated in FIG. 1.

FIGS. 2A to 2C are graphs illustrating simulation results of insertion loss of the duplexers 30 in the communication module 100A. In the graphs illustrated in FIGS. 2A to 2C, the vertical axis represents the insertion loss (dB) of signals (that is, the scattering parameter (S parameter) for the received nodes 33a, 33b, and 33c relative to the common nodes 31a, 31b, and 31c, respectively, and the horizontal axis represents frequency (MHz). FIG. 2A depicts the insertion loss of received signals in Band 26 in the duplexer 30a, FIG. 2B depicts the insertion loss of received signals in Band 20 in the duplexer 30b, and FIG. 2C depicts the insertion loss of received signals in Band 12 in the duplexer 30c.

The simulation results show that the maximum insertion losses in the respective frequency bands are −2.322 dB at a frequency of 859 MHz in Band 26, −2.092 dB at a frequency of 791 MHz in Band 20, and −1.950 dB at a frequency of 728 MHz in Band 12. Thus, as illustrated in FIGS. 2A to 2C, the frequency bands with the greatest maximum signal insertion losses in the duplexers 30a, 30b, and 30c, in descending order, are Band 26, Band 20, and Band 12. The different maximum values of signal loss in the duplexers depending on the frequency bands result from different bandwidths of the frequency bands or from different differences between the transmit frequencies and the received frequencies in the frequency bands. A description will be given below of how the variations in the maximum values of signal loss are reduced.

Referring back to FIG. 1, each of the low-noise amplifiers 40a, 40b, and 40c amplifies an input received signal to a level that is necessary to demodulate the received signal, and outputs the amplified signal. Specifically, for example, the low-noise amplifier 40a (first low-noise amplifier) amplifies a received signal (first received signal) in the band Band_a input from a terminal 41a. The low-noise amplifier 40b (second low-noise amplifier) amplifies a received signal (second received signal) in the band Band_b input from a terminal 41b. The low-noise amplifier 40c amplifies a received signal in the band Band_c input from a terminal 41c. The received signals outputted from the low-noise amplifiers 40 are demodulated into baseband signals. In this embodiment, the antenna switch 20, the duplexers 30, and the low-noise amplifiers 40 are mounted on the same substrate.

Each of the power amplifiers 50a, 50b, and 50c amplifies the power of an input transmit signal to a level that is necessary to transmit the input transmit signal to the base station, and outputs the amplified signal. Specifically, for example, the power amplifier 50a (first power amplifier) amplifies a transmit signal (first transmit signal) in the band Band_a and outputs the amplified signal (first amplified signal). The power amplifier 50b (second power amplifier)

amplifies a transmit signal (second transmit signal) in the band Band_b and outputs the amplified signal (second amplified signal). The power amplifier 50c amplifies a transmit signal in the band Band_c and outputs the amplified signal. Each of the power amplifiers 50 may be constituted by two or more stages.

The lines 60a, 60b, and 60c represent signal paths between the terminals 22a, 22b, and 22c of the antenna switch 20 and the common nodes 31a, 31b, and 31c of the duplexers 30a, 30b, and 30c, respectively. The lines 61a, 61b, and 61c represent signal paths between the received nodes 33a, 33b, and 33c of the duplexers 30a, 30b, and 30c and the terminals 41a, 41b, and 41c of the low-noise amplifiers 40a, 40b, and 40c, respectively. The arrangement of constituent elements according to this embodiment will be described with reference to FIG. 3.

Figure 3:
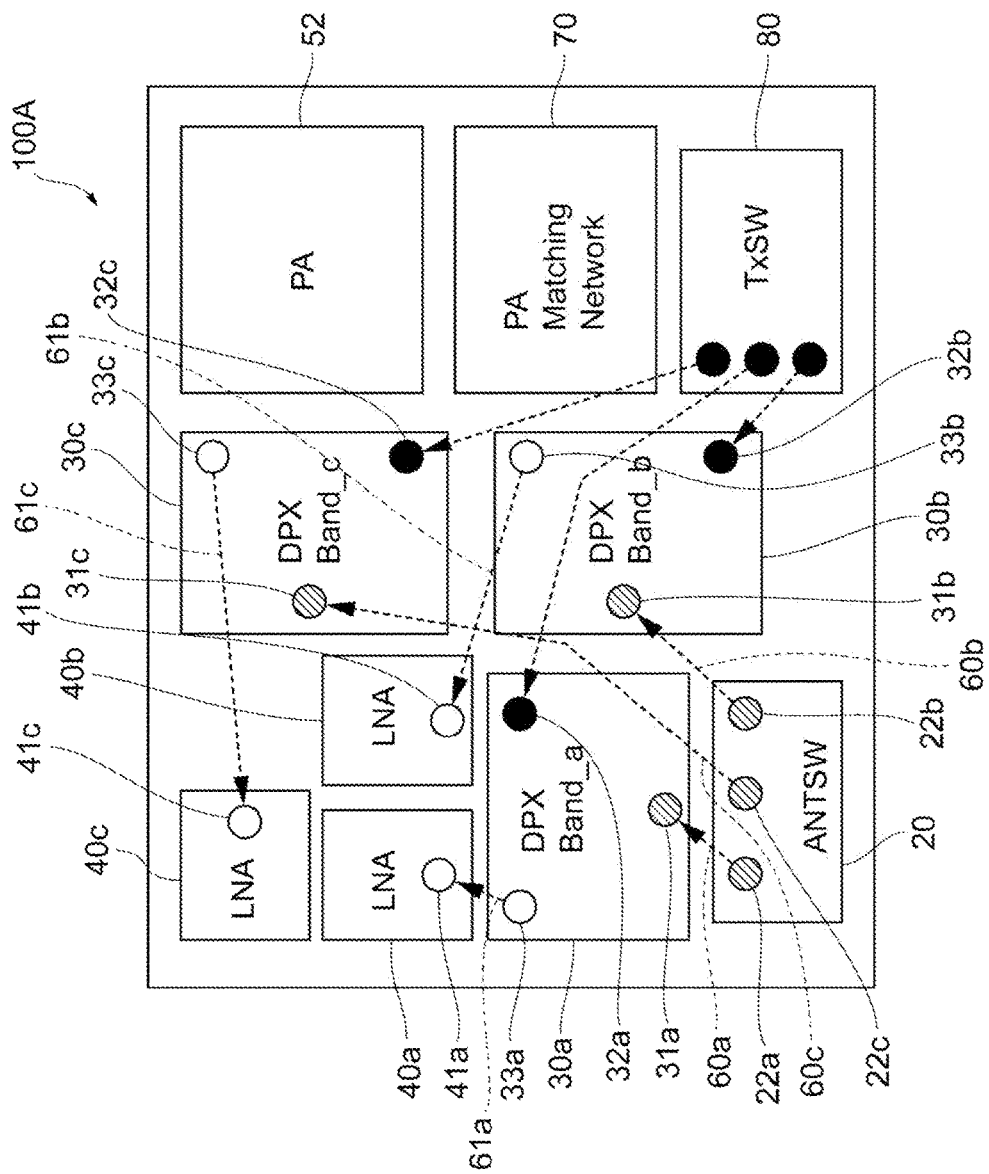
FIG. 3 schematically illustrates an example arrangement of constituent elements in the communication module according to the first embodiment of the present disclosure.

FIG. 3 schematically illustrates an example arrangement of constituent elements in a communication module according to a first embodiment of the present disclosure. For convenience of illustration, elements corresponding to the constituent elements illustrated in FIG. 1 among the constituent elements illustrated in FIG. 3 are identified with numerals similar to those illustrated in FIG. 1 and are not described in detail herein.

The communication module 100A has mounted therein the antenna switch 20, the duplexers 30a, 30b, and 30c, the low-noise amplifiers 40a, 40b, and 40c, a power amplifier 52, the lines 60a, 60b, 60c, 61a, 61b, and 61c, a matching circuit 70, and a switch circuit 80.

The power amplifier 52 includes the power amplifiers 50a, 50b, and 50c illustrated in FIG. 1. The matching circuit 70 matches the output impedance of the power amplifier 52 to the input impedance of the switch circuit 80. The switch circuit 80 outputs a transmit signal input from the power amplifier 52 via the matching circuit 70 to the transmit node 32a of the duplexer 30a, the transmit node 32b of the duplexer 30b, or the transmit node 32c of the duplexer 30c in accordance with the frequency band. The remaining constituent elements are similar to those illustrated in FIG. 1 and are not described in detail herein.

In the communication module 100A, as illustrated in FIG. 3, the lengths of signal paths from the antenna switch 20 to the low-noise amplifiers 40a, 40b, and 40c are adjusted in such a manner as to cancel out variations in signal loss in the duplexers 30a, 30b, and 30c. Since signal loss in a signal path increases as the length of the signal path increases, variations in signal loss in duplexers can be canceled out by adjusting the lengths of signal paths. Specifically, the constituent elements are arranged on a substrate in such a manner that, for a band that exhibits relatively large signal loss in a duplexer 30, the length of the signal path from the antenna switch 20 to the corresponding one of the low-noise amplifiers 40 via the duplexer 30 becomes relatively short and for a band that exhibits small signal loss in a duplexer 30, the length of the signal path from the antenna switch 20 to the corresponding one of the low-noise amplifiers 40 via the duplexer 30 becomes relatively long (see FIG. 3). For instance, the total length of the lines 60a and 61a associated with the band Band_a (Band 26) is shorter than the total length of the lines 60b and 61b associated with the band Band_b (Band 20). Further, the total length of the lines 60b and 61b associated with the band Band_b (Band 20) is shorter than the total length of the lines 60c and 61c associated with the band Band_c (Band 12). Accordingly, the signal loss in the lines 60 and 61 is relatively small for a band that exhibits relatively large signal loss in a duplexer. Thus, variations in signal loss due to different frequency bands are reduced, and variations in receiver sensitivity for the respective frequency bands are reduced.

The frequency bands described above are non-limiting examples of the frequency bands supported by the communication module 100A. For example, the band Band_a, which is a band that exhibits large signal loss in the duplexer 30a and with which a relatively short signal path is associated, may be Band 8 (which covers received frequencies of 925 to 960 MHz) instead of Band 26.

FIGS. 1 and 3 illustrate a module supporting three frequency bands, for simplicity of illustration. However, the communication module 100A may have any other configuration and may support two or four or more frequency bands. The communication module 100A may further include a diplexer between the antenna 10 and the antenna switch 20 to separate received signals from the antenna 10 into frequency bands or to combine transmit signals in a plurality of frequency bands. The communication module 100A may include any other filter circuit or the like associated with each frequency band.

Figure 4:
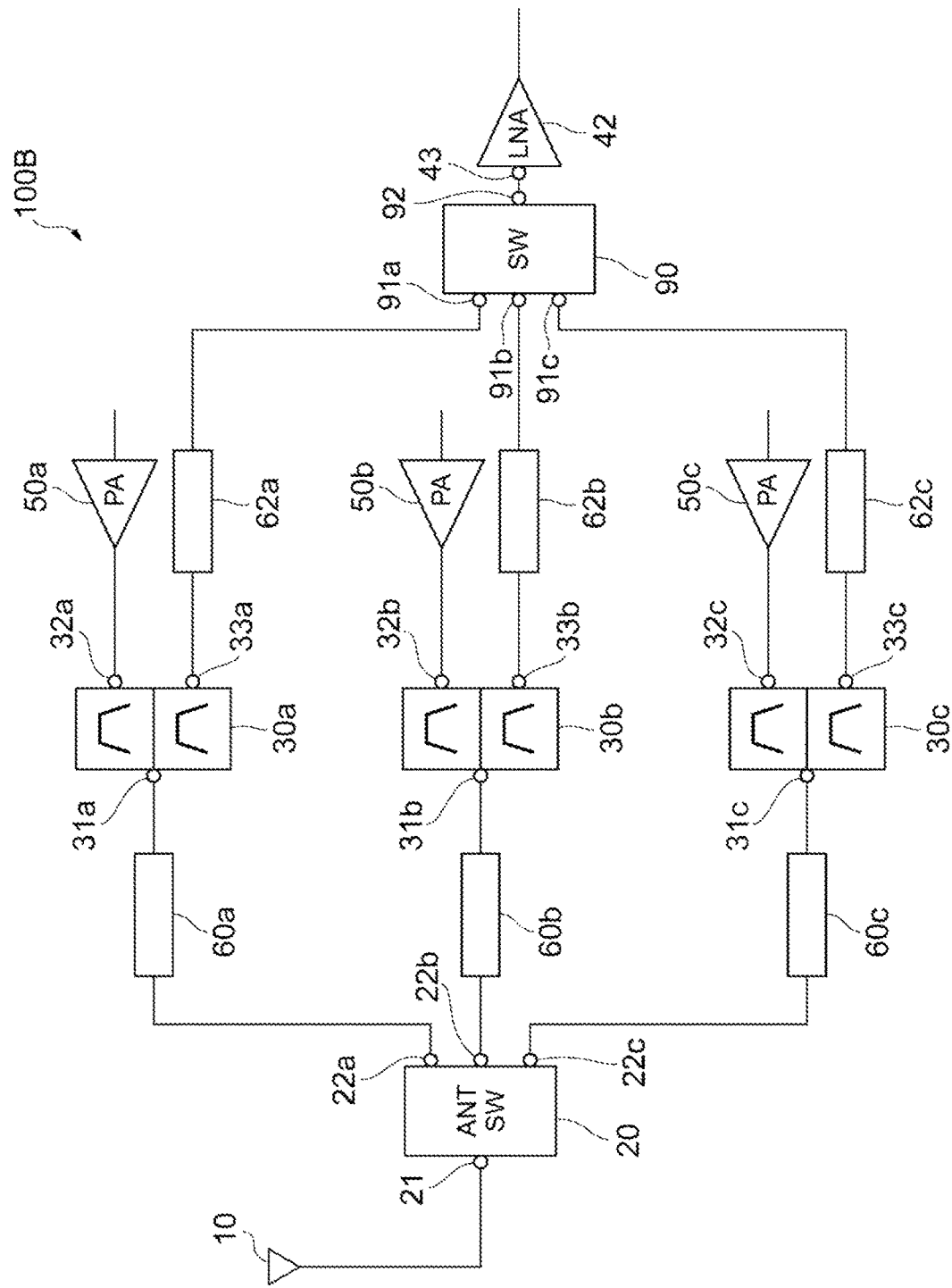
FIG. 4 illustrates an example configuration of a communication module according to a second embodiment of the present disclosure.

FIG. 4 illustrates a communication module 100B, which is an example configuration of a communication module according to a second embodiment of the present disclosure. In the second and subsequent embodiments, features common to the communication module 100A according to the embodiment illustrated in FIG. 1 are not described and only the differences will be described. In particular, similar effects achieved using similar configurations will not be repeatedly described in the individual embodiments.

Unlike the communication module 100A illustrated in FIG. 1, the communication module 100B further includes a switch circuit 90 and includes a low-noise amplifier 42 instead of the low-noise amplifiers 40.

Any of received signals outputted from the duplexers 30a, 30b, and 30c is inputted to a corresponding one of terminals 91a, 91b, and 91c of the switch circuit 90 (third switch circuit), and is outputted from a terminal 92 of the switch circuit 90 to a terminal 43 of the low-noise amplifier 42. Like the low-noise amplifiers 40, the low-noise amplifier 42 amplifies the received signal input from the terminal 43 to a level that is necessary to demodulate the received signal, and outputs the amplified signal.

In the communication module 100B, the total lengths of the lines 60 between the antenna switch 20 and the duplexers 30 and the lines 62 between the duplexers 30 and the switch circuit 90 differ depending on the frequency band. Specifically, the total length of the lines 60a and 62a associated with the band Band_a is shorter than the total length of the lines 60b and 62b associated with the band Band_b. Further, the total length of the lines 60b and 62b associated with the band Band_b is shorter than the total length of the lines 60c and 62c associated with the band Band_c.

Figure 5:
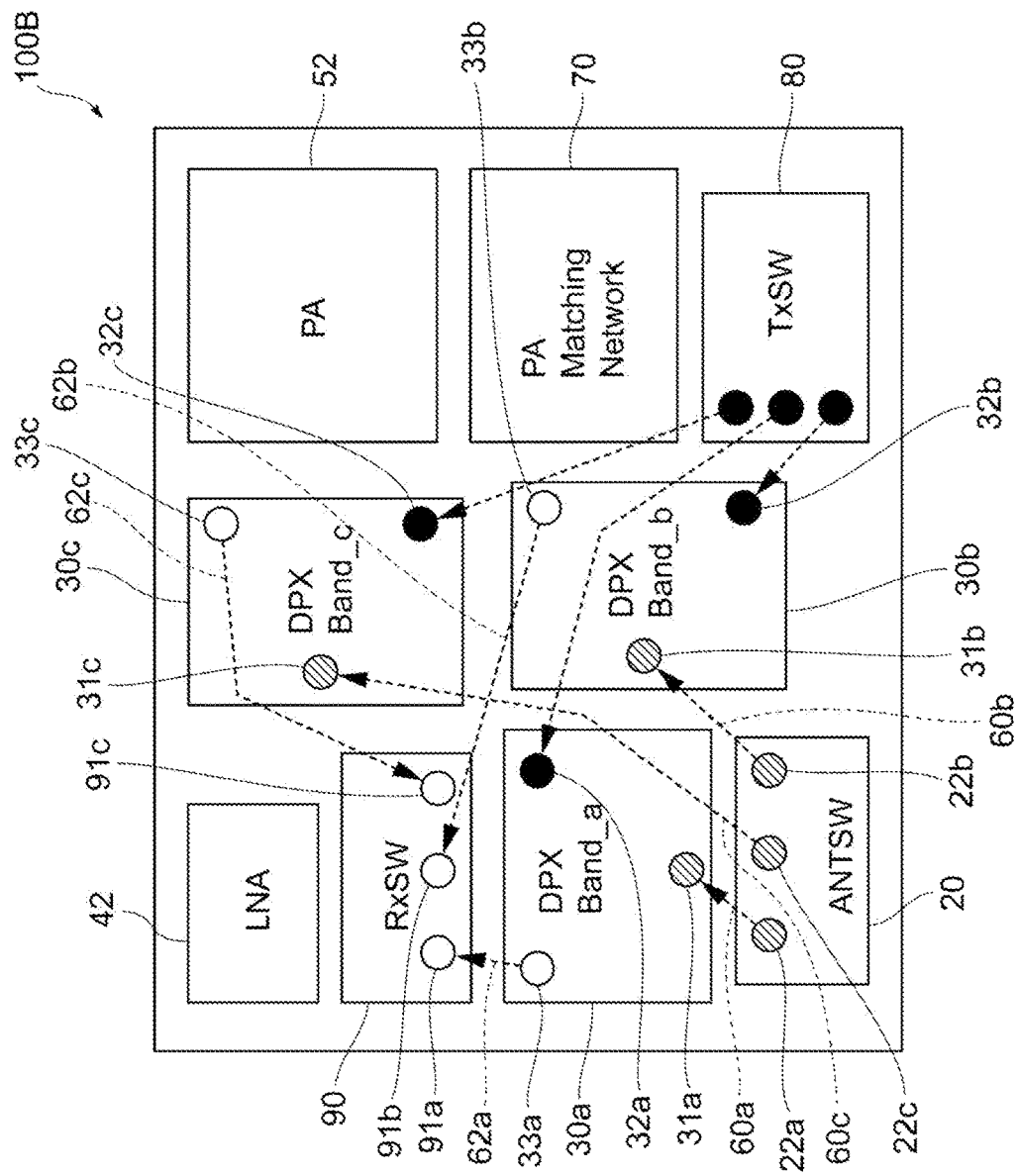
FIG. 5 schematically illustrates an example arrangement of constituent elements in the communication module according to the second embodiment of the present disclosure.

FIG. 5 schematically illustrates an example arrangement of constituent elements in the communication module according to the second embodiment of the present disclosure. For convenience of illustration, elements corresponding to the constituent elements illustrated in FIG. 4 among the constituent elements illustrated in FIG. 5 are identified with numerals similar to those illustrated in FIG. 4 and are not described in detail herein.

Unlike the communication module 100A illustrated in FIG. 3, the communication module 100B includes the low-noise amplifier 42 instead of the low-noise amplifiers 40a, 40b, and 40c, and the lines 62a, 62b, and 62c instead of the lines 61a, 61b, and 61c, and further includes the switch circuit 90.

In the communication module 100B, as in the communication module 100A illustrated in FIG. 3, the total length of the lines 60a and 62a associated with the band Band_a is shorter than the total length of the lines 60b and 62b associated with the band Band_b. Further, the total length of the lines 60b and 62b associated with the band Band_b is shorter than the total length of the lines 60c and 62c associated with the band Band_c. Accordingly, the signal loss in signal paths is relatively small for a band that exhibits relatively large signal loss in a duplexer. Thus, variations in signal loss due to different frequency bands are reduced, and variations in receiver sensitivity for the respective frequency bands are reduced.

The configuration described above also enables the communication module 100B to achieve advantages similar to those of the communication module 100A. In addition, the communication module 100B includes fewer low-noise amplifiers and fewer output terminals of low-noise amplifiers than the communication module 100A and thus is smaller in size than the communication module 100A.

Figure 6:
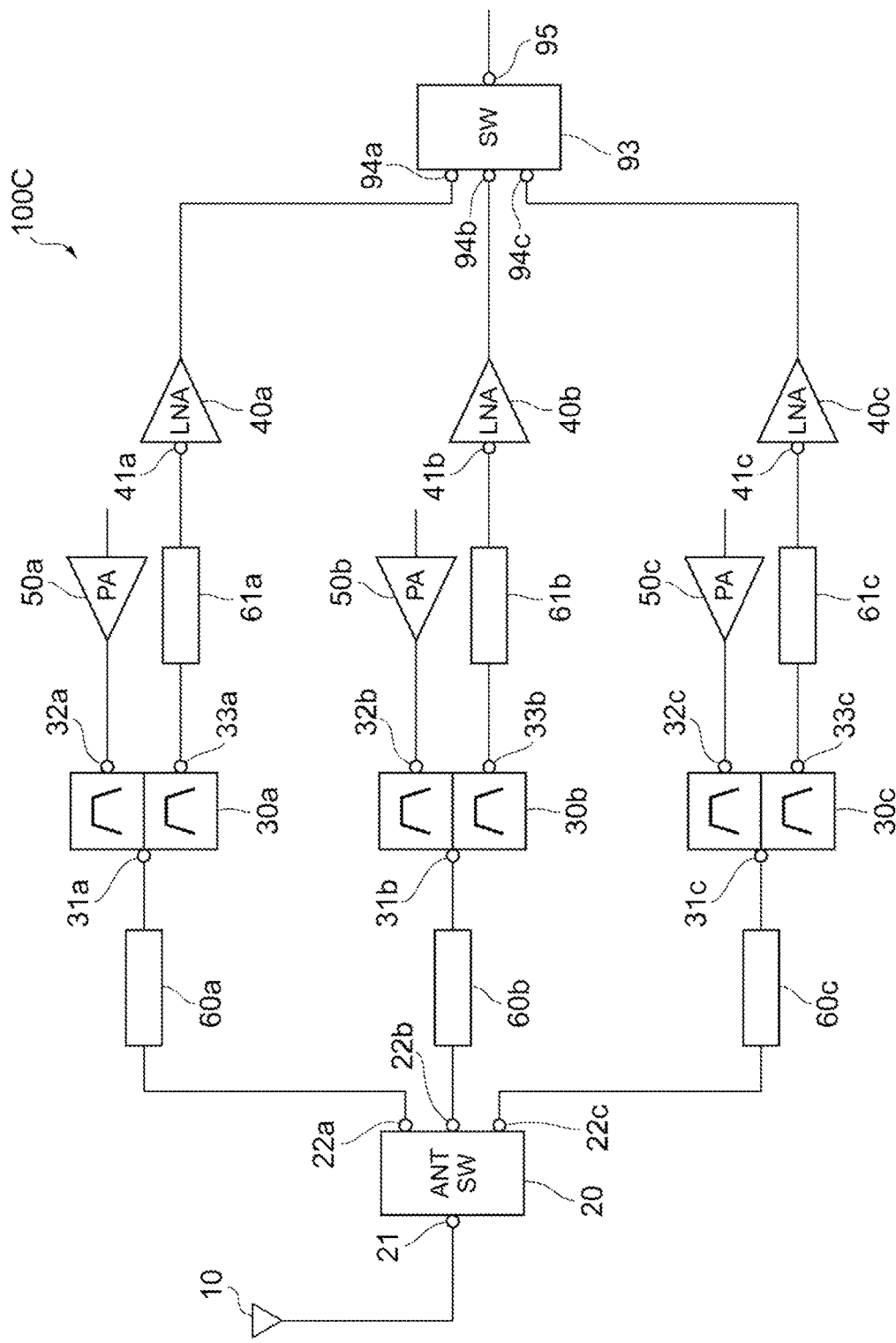
FIG. 6 illustrates an example configuration of a communication module according to a third embodiment of the present disclosure.

FIG. 6 illustrates a communication module 100C, which is an example configuration of a communication module according to an embodiment of the present disclosure. Unlike the communication module 100A, the communication module 100C further includes a switch circuit 93.

Any of received signals outputted from the low-noise amplifiers 40a, 40b, and 40c is inputted to a corresponding one of terminals 94a, 94b, and 94c of the switch circuit 93 (second switch circuit), and is outputted from a terminal 95 of the switch circuit 93. Inserting a switch circuit after the low-noise amplifiers 40 in the manner described above reduces signal loss that is due to the insertion of a switch circuit, compared with the communication module 100B, in which a switch circuit is inserted before the low-noise amplifier. A more specific description will now be given. The noise figure (NF) from the antenna switch 20 to the output terminal of the low-noise amplifier 42 in the communication module 100B illustrated in FIG. 4 is the sum of the signal loss in the antenna switch 20, the duplexers 30, the lines 60 and 62, and the switch circuit 90 and the noise figure in the low-noise amplifier 42. In contrast, the corresponding noise figure in the communication module 100C illustrated in FIG. 6 is the sum of the signal loss in the antenna switch 20, the duplexers 30, and the lines 60 and 61, the noise figure in the low-noise amplifiers 40, and a value obtained by dividing the loss in the switch circuit 93 by the gain of the low-noise amplifiers 40. Thus, the communication module 100C provides a lower noise figure than the communication module 100B by an amount obtained by dividing the signal loss resulting from the switch circuit 93 by the gain of the low-noise amplifiers 40.

The configuration described above also enables the communication module 100C to achieve advantages similar to those of the communication module 100A. In addition, the communication module 100C includes fewer output terminals of low-noise amplifiers than the communication module 100A and thus is smaller in size than the communication module 100A. In addition, the communication module 100C provides a lower noise figure than the communication module 100B, and results in less noise.

While FIGS. 4 and 6 illustrate a configuration in which the switch circuits 90 and 93 are used to combine three signal paths into a single path, the configuration of a switch circuit according to some embodiments is not limited to the illustrated configuration. For example, two out of the three signal paths may be combined by a switch circuit, and the combined signal path and the remaining signal path may further be combined by another switch circuit.

Exemplary embodiments of the present disclosure have been described. In the communication modules 100A and 100C, signal loss in the duplexer 30a is greater than signal loss in the duplexer 30b and the signal path from the antenna switch 20 to the low-noise amplifier 40a via the duplexer 30a is shorter than the signal path from the antenna switch 20 to the low-noise amplifier 40b via the duplexer 30b. This arrangement enables variations in signal loss in the duplexers 30a, 30b, and 30c to be canceled out by adjusting the lengths of the signal paths. Thus, variations in signal loss due to different frequency bands are reduced, and variations in receiver sensitivity for the respective frequency bands are reduced.

The communication module 100C further includes the switch circuit 93 subsequent to the low-noise amplifiers 40a, 40b, and 40c. This configuration reduces insertion loss resulting from a switch circuit, compared to a configuration in which a switch circuit is inserted prior to a low-noise amplifier. Thus, the communication module 100C provides a lower noise figure than the communication module 100B.

While the configuration of the communication modules 100A and 100C is not limited particularly, each of the communication modules 100A and 100C may further include the power amplifiers 50a, 50b, and 50c, for example.

In the communication module 100B, signal loss in the duplexer 30a is greater than signal loss in the duplexer 30b and the signal path from the antenna switch 20 to the switch circuit 90 via the duplexer 30a is shorter than the signal path from the antenna switch 20 to the switch circuit 90 via the duplexer 30b. This arrangement enables variations in signal loss in the duplexers 30a, 30b, and 30c to be canceled out by adjusting the lengths of the signal paths. Thus, variations in signal loss due to different frequency bands are reduced, and variations in receiver sensitivity for the respective frequency bands are reduced.

While the configuration of the communication module 100B is not limited particularly, the communication module 100B may further include the power amplifiers 50a, 50b, and 50c, for example.

The embodiments described above are intended to help easily understand the present disclosure, and are not to be used to construe the present disclosure in a limiting fashion. Various modifications or improvements can be made to the present disclosure without departing from the gist of the present disclosure, and equivalents thereof are also included in the present disclosure. That is, the embodiments may be appropriately modified in design by those skilled in the art, and such modifications also fall within the scope of the present disclosure so long as the modifications include the features of the present disclosure. For example, the elements included in the embodiments described above and the arrangement, materials, conditions, shapes, sizes, and the like thereof are not limited to those described in the illustrated examples but can be modified as appropriate. Furthermore, the elements included in the embodiments can be combined as much as technically possible, and such combinations of elements also fall within the scope of the present disclosure so long as the combinations of elements include the features of the present disclosure.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A communication module comprising:
   a first switch circuit configured to receive a first receive signal in a first frequency band or a second receive signal in a second frequency band, and output the first receive signal from a first terminal or output the second receive signal from a second terminal;
   a first low-noise amplifier configured to amplify the first receive signal;
   a second low-noise amplifier configured to amplify the second receive signal;
   a first filter circuit disposed between the first terminal of the first switch circuit and the first low-noise amplifier, the first filter circuit being configured to pass receive frequencies in the first frequency band; and
   a second filter circuit disposed between the second terminal of the first switch circuit and the second low-noise amplifier, the second filter circuit being configured to pass receive frequencies in the second frequency band, wherein
   the first filter circuit has greater signal loss than the second filter circuit, and
   a signal path from the first terminal of the first switch circuit to the first low-noise amplifier via the first filter circuit is shorter than a signal path from the second terminal of the first switch circuit to the second low-noise amplifier via the second filter circuit.

2. The communication module according to claim 1, further comprising:
   a second switch circuit configured to receive the first receive signal amplified by the first low-noise amplifier or the second receive signal amplified by the second low-noise amplifier, and output the received first receive signal or second receive signal.

3. The communication module according to claim 1, further comprising:
   a first power amplifier configured to amplify a first transmit signal in the first frequency band and output a first amplified signal; and
   a second power amplifier configured to amplify a second transmit signal in the second frequency band and output a second amplified signal, wherein
   the first filter circuit is a duplexer configured to output the first amplified signal to the first terminal of the first switch circuit and output the first receive signal to the first low-noise amplifier, and
   the second filter circuit is a duplexer configured to output the second amplified signal to the second terminal of the first switch circuit and output the second receive signal to the second low-noise amplifier.

4. The communication module according to claim 2, further comprising:
   a first power amplifier configured to amplify a first transmit signal in the first frequency band and output a first amplified signal; and
   a second power amplifier configured to amplify a second transmit signal in the second frequency band and output a second amplified signal, wherein
   the first filter circuit is a duplexer configured to output the first amplified signal to the first terminal of the first switch circuit and output the first receive signal to the first low-noise amplifier, and
   the second filter circuit is a duplexer configured to output the second amplified signal to the second terminal of the first switch circuit and output the second receive signal to the second low-noise amplifier.

5. The communication module according to claim 1, wherein the first switch circuit is further configured to receive a third receive signal in a third frequency band and output the third receive signal from a third terminal, the communication module further comprising:
   a third low-noise amplifier configured to amplify the third receive signal;
   a third filter circuit disposed between the third terminal of the first switch circuit and the third low-noise amplifier, the third filter circuit being configured to pass receive frequencies in the third frequency band, wherein
   the second filter circuit has greater signal loss than the third filter circuit, and
   a signal path from the second terminal of the first switch circuit to the second low-noise amplifier via the second filter circuit is shorter than a signal path from the third terminal of the first switch circuit to the third low-noise amplifier via the third filter circuit.

6. A communication module comprising:
   a first switch circuit configured to receive a first receive signal in a first frequency band or a second receive signal in a second frequency band, and output the first receive signal from a first terminal or the second receive signal from a second terminal;
   a first filter circuit configured to receive the first receive signal from the first terminal of the first switch circuit, the first filter circuit being configured to pass receive frequencies in the first frequency band;
   a second filter circuit configured to receive the second receive signal from the second terminal of the first switch circuit, the second filter circuit being configured to pass receive frequencies in the second frequency band;
   a third switch circuit configured to receive the first receive signal from the first filter circuit or the second receive signal from the second filter circuit, and output the received first receive signal or second receive signal; and
   a low-noise amplifier configured to amplify the first receive signal or second receive signal output from the third switch circuit, wherein
   the first filter circuit has greater signal loss than the second filter circuit, and
   a signal path from the first terminal of the first switch circuit to the third switch circuit via the first filter circuit is shorter than a signal path from the second terminal of the first switch circuit to the third switch circuit via the second filter circuit.

7. The communication module according to claim 6, further comprising:
   a first power amplifier configured to amplify a first transmit signal in the first frequency band and output a first amplified signal; and
   a second power amplifier configured to amplify a second transmit signal in the second frequency band and output a second amplified signal, wherein
   the first filter circuit is a duplexer configured to output the first amplified signal to the first terminal of the first switch circuit and output the first receive signal to the third switch circuit, and
   the second filter circuit is a duplexer configured to output the second amplified signal to the second terminal of the first switch circuit and output the second receive signal to the third switch circuit.

8. The communication module according to claim 6,
wherein the first switch circuit is further configured to receive a third receive signal in a third frequency band and output the third receive signal from a third terminal,
the communication module further comprises a third filter circuit configured to receive the third receive signal from the third terminal of the first switch circuit, the third filter circuit being configured to pass receive frequencies in the third frequency band,
wherein the third switch circuit is further configured to receive the third receive signal from the third filter circuit and output the received third receive signal,
wherein the low-noise amplifier is further configured to amplify the third receive signal output from the third switch circuit,
wherein the second filter circuit has greater signal loss than the third filter circuit, and
wherein a signal path from the second terminal of the first switch circuit to the third switch circuit via the second filter circuit is shorter than a signal path from the third terminal of the first switch circuit to the third switch circuit via the third filter circuit.

* * * * *